(12) United States Patent
Mizusaki et al.

(10) Patent No.: US 10,707,370 B2
(45) Date of Patent: Jul. 7, 2020

(54) PHOTOELECTRIC SENSOR

(71) Applicant: OMRON Corporation, Kyoto (JP)

(72) Inventors: Hiroyuki Mizusaki, Kyoto (JP);
Tsuyoshi Miyata, Kyoto (JP); Makoto Sugimoto, Kyoto (JP); Jumpei Nakamura, Kyoto (JP); Tomohiro Tsuji, Kyoto (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 16/276,588

(22) Filed: Feb. 14, 2019

(65) Prior Publication Data
US 2019/0288154 A1    Sep. 19, 2019

(30) Foreign Application Priority Data

Mar. 15, 2018   (JP) .................... 2018-047934

(51) Int. Cl.
| | | |
|---|---|---|
| H01L 31/0203 | (2014.01) |
| H01L 31/153 | (2006.01) |
| G01S 7/481 | (2006.01) |
| G01V 8/12 | (2006.01) |
| G01S 17/04 | (2020.01) |
| H01L 31/0232 | (2014.01) |
| G01V 8/18 | (2006.01) |
| G01V 8/14 | (2006.01) |
| G01V 8/20 | (2006.01) |

(52) U.S. Cl.
CPC .......... *H01L 31/153* (2013.01); *G01S 7/4813* (2013.01); *G01S 17/04* (2020.01); *G01V 8/12* (2013.01); *H01L 31/0203* (2013.01); *H01L 31/0232* (2013.01); *H01L 31/02322* (2013.01); *H01L 31/02325* (2013.01); *H01L 31/02327* (2013.01); *G01V 8/14* (2013.01); *G01V 8/18* (2013.01); *G01V 8/20* (2013.01)

(58) Field of Classification Search
None
See application file for complete search history.

(56) References Cited

U.S. PATENT DOCUMENTS

2017/0254700 A1* 9/2017 Mizusaki ................. G01J 1/44

FOREIGN PATENT DOCUMENTS

| | | |
|---|---|---|
| JP | 2007073417 | 3/2007 |
| JP | 2008298485 | 12/2008 |
| JP | 5162902 | 3/2013 |
| JP | 6020033 | 11/2016 |

OTHER PUBLICATIONS

"Search Report of Europe Counterpart Application", dated Jul. 30, 2019, pp. 1-8.

* cited by examiner

*Primary Examiner* — Minh Loan Tran
(74) *Attorney, Agent, or Firm* — JCIPRNET

(57) ABSTRACT

A photoelectric sensor capable of saving a space is provided. A photoelectric sensor includes a case body with a substantially rectangular parallelepiped shape that accommodates at least one of a light projecting section and a light receiving section. The case body has a front surface that has a light projecting and receiving surface that allows at least one of light from the light projecting section and light to the light receiving section to pass therethrough and a rear surface that is located on a side opposite to the front surface, and a cable that accommodates cords that are connected to at least one of the light projecting section and the light receiving section via a control section is attached to the rear surface.

10 Claims, 7 Drawing Sheets

PHOTOELECTRIC SENSOR

CROSS-REFERENCE TO RELATED APPLICATION

This application claims the priority of Japan patent application serial no. 2018-047934, filed on Mar. 15, 2018. The entirety of the above-mentioned patent application is hereby incorporated by reference herein and made a part of this specification.

BACKGROUND

Technical Field

The disclosure relates to a photoelectric sensor.

Description of Related Art

As a device that detects presence of an object in a detection region or a surface state or the like of the object, a photoelectric sensor is used. In a photoelectric sensor, a light projecting section that emits light and a light receiving section that receives light are accommodated inside a case (hereinafter referred to as a case body).

In a photoelectric sensor described in Patent Document 1 (Japanese Laid-Open No. 2007-073417), for example, a mounted board on which electronic components (a light projecting element, a light receiving element, and the like) that form a light projecting and receiving section, electronic components that form a signal processing section, and the like are mounted, lenses, and the like are accommodated in a case body. The case body has an opening section for allowing detection light emitted from the light projecting section and returning light received by the light receiving section to pass therethrough. Also, a cable for supplying power from the outside of the photoelectric sensor to the mounted board and transmitting a signal processed by a light receiving circuit to the outside of the photoelectric sensor, for example, is connected to the case body. The cable is connected to the side of a bottom surface of the case body in Patent Document 1.

Incidentally, in the photoelectric sensor that is used in a production facility and the like, further space saving is required. However, a photoelectric sensor in the related art cannot sufficiently respond to the requirement for space saving. Specifically, in a case of a configuration in which a cable is connected to a case body that accommodates a light projecting and receiving section and the like on a side of a bottom surface thereof as the photoelectric sensor in the related art illustrated in FIG. 7, for example, the cable is routed and used depending on the orientation of the placement of the photoelectric sensor in some cases. In such cases, since it is necessary to secure at least a space for routing the cable on the side of the bottom surface of the case body, wasted space in the placement space of the photoelectric sensor may be a concern.

SUMMARY

According to an embodiment of the disclosure, there is provided a photoelectric sensor that has at least one of a light projecting section that emits light to a front space and a light receiving section that receives light from a front zone, the photoelectric sensor including: a case body with a substantially rectangular parallelepiped shape that accommodates at least one of the light projecting section and the light receiving section, wherein the case body has a front surface that has a light projecting and receiving surface that allows at least one of light from the light projecting section and light to the light receiving section to pass therethrough, and a rear surface that is located on a side opposite to the front surface, at least one of the light projecting section and the light receiving section is connected to a cord via a control section, and a cable that accommodates the cord is attached to the rear surface.

DESCRIPTION OF THE EMBODIMENTS

Figure 1:
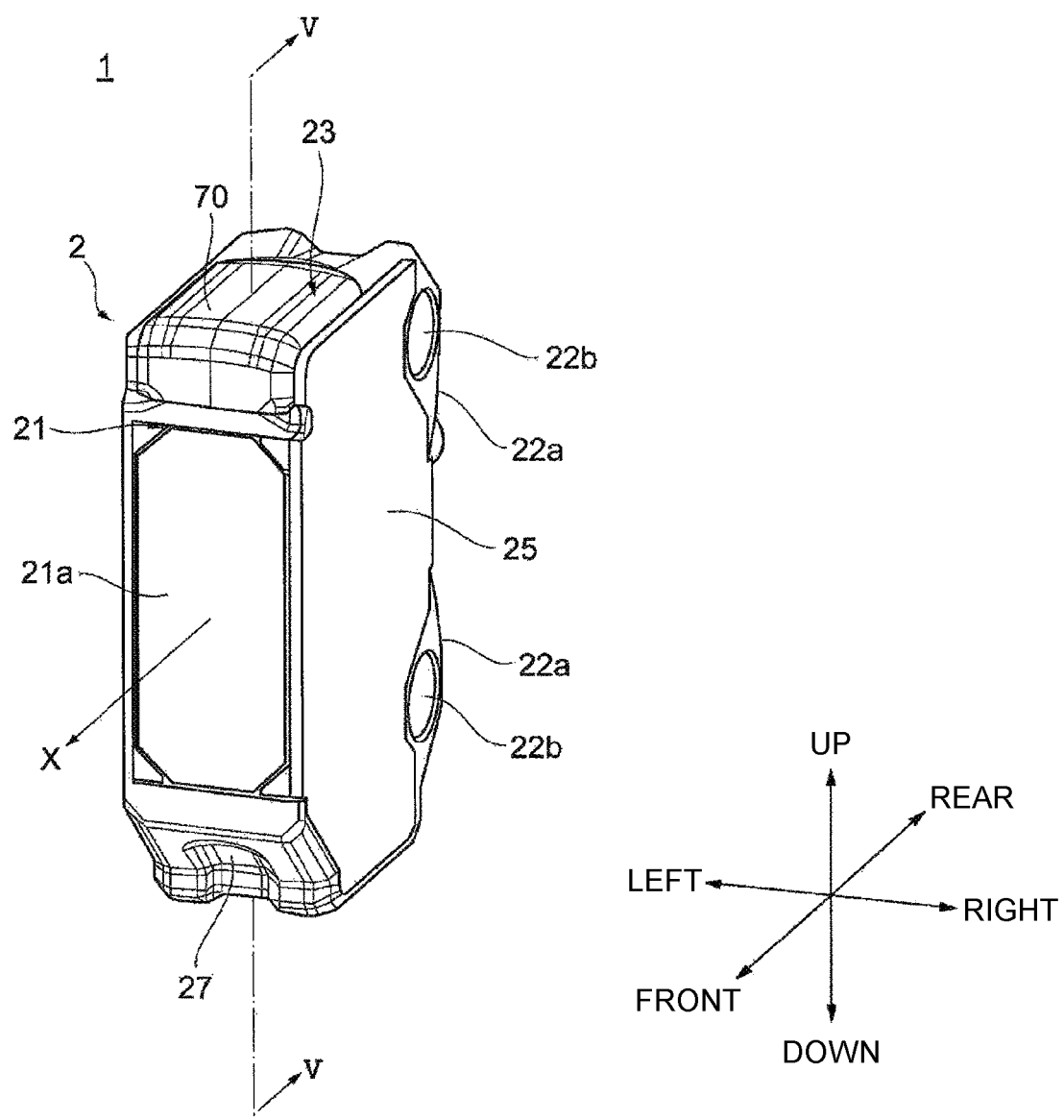
FIG. 1 is a perspective view of a photoelectric sensor according to an embodiment when seen from one direction.

Thus, the disclosure provides a photoelectric sensor capable of saving space.

According to an embodiment of the disclosure, there is provided a photoelectric sensor that has at least one of a light projecting section that emits light to a front space and a light receiving section that receives light from a front zone, the photoelectric sensor including: a case body with a substantially rectangular parallelepiped shape that accommodates at least one of the light projecting section and the light receiving section, wherein the case body has a front surface that has a light projecting and receiving surface that allows at least one of light from the light projecting section and light to the light receiving section to pass therethrough, and a rear surface that is located on a side opposite to the front surface, at least one of the light projecting section and the light receiving section is connected to a cord via a control section, and a cable that accommodates the cord is attached to the rear surface.

According to the embodiment of the disclosure, since the cable that accommodates the cord is attached to the rear surface that is located on the side opposite to the light projecting and receiving surface, it is not necessary to secure a space for routing the cable on the side of the bottom surface of the case body (in other words, the up-down direction of the case body). In this manner, it is possible to save space for the photoelectric sensor in the up-down direction of the case body as compared with a configuration in which the cable is connected to the case body on the side of the bottom surface thereof.

According to an embodiment of the disclosure, a plurality of attachment sections for securing the case body to an outside may be provided on the rear surface, and the cable may be attached between the attachment section that is located on an upper side on the rear surface and the attachment section that is located on a lower side on the rear surface.

According to the embodiment of the disclosure, since the cable is attached between the attachment section of the rear surface of the case body on the upper side and the attachment section of the rear surface on the lower side, it is possible to effectively utilize the space of the rear surface and to reduce the size of the case body.

According to an embodiment of the disclosure, the cable may be attached to the rear surface such that an end of the cable is located inside the case body, and a protection member that covers a periphery of the end may be provided.

According to the embodiment of the disclosure, since the protection member that covers the periphery of the end of the cable is provided, bending from the end of the cable can be suppressed and bending durability of the cable can be improved.

According to an embodiment of the disclosure, the case body may further accommodate a substrate on which the light projecting section and the light receiving section are mounted and a portion of the cord that is not covered with the cable.

According to the embodiment of the disclosure, since the substrate and the cord are further accommodated in the case body, it is possible to save space when placing the photoelectric sensor, for example, compared with a photoelectric sensor in which the cord is disposed outside the case body.

According to an embodiment of the disclosure, the cord may be connected to an end of the substrate formed in substantially a plate shape, and the light projecting section and the light receiving section may be disposed closer to an end of the substrate opposite to the end of the substrate.

According to the embodiment of the disclosure, since the light projecting section and the light receiving section are disposed closer to the end opposite to the end of the substrate to which the cord is connected, it is possible to suppress occurrence of noise which may be generated when a cord connection location of the substrate and the location of the light projecting section and the light receiving section are near each other.

According to an embodiment of the disclosure, the cord may have a portion that extends from the end of the substrate to one surface side inside the case body and is curved toward the side of the rear surface and a portion that extends from the portion to a side of the end of the cable.

According to the embodiment of the disclosure, since the cord has the portion that extends from the end of the substrate to the surface side inside the case body and is curved toward the side of the rear surface and the portion that extends from the portion to the side of the end of the cable, it is possible to secure a longer cord length to be accommodated in the case body. It is possible to suppress oscillation delivered from the outside to the substrate via the core by securing the cord length in this manner.

According to the embodiments of the disclosure, it is possible to provide a photoelectric sensor capable of saving space.

Referring to the accompanying drawings, a photoelectric sensor according to a preferred embodiment of the disclosure will be described. For convenience of explanation, directions such as front, rear, left, right, up, and down will be described with reference to FIGS. 1 and 2. In the respective drawings, components with the same reference numerals have the same or similar configurations.

As illustrated in FIGS. 1 to 5, a photoelectric sensor 1 includes a case body 2 with a substantially rectangular parallelepiped shape. A light projecting section 31 (FIG. 5), a light receiving section 32, and the like are accommodated in the case body 2. Hereinafter, the light projecting section 31 and the light receiving section 32 will collectively be referred to as a light projecting and receiving section. Also, although the following description will be given on the assumption of an example in which the light projecting section 31 and the light receiving section 32 are accommodated in the case body 2, the disclosure is not limited to the example illustrated in the drawing, and at least one of the light projecting section 31 and the light receiving section 32 may be accommodated in the case body 2 in the embodiment. That is, a mode in which the light projecting section 31 and the light receiving section 32 are accommodated in separate case bodies is also included among photoelectric sensors according to embodiments.

The case body 2 is formed of a resin or metal, for example. The case body 2 has a front surface 21, a rear surface 22, a top surface 23, a bottom surface 24, a side surface 25, and a side surface 26 with respect to the six surfaces that form the rectangular parallelepiped shape. The front surface 21 and the rear surface 22 face one another with the inside of the case body 2 interposed therebetween. Similarly, the top surface 23 and the bottom surface 24 face one another with the inside of the case body 2 interposed therebetween, and the side surface 25 and the side surface 26 face one another with the inside of the case body 2 interposed therebetween. The front surface 21 and the rear surface 22 are formed to be longer in the up-down direction than in a left-right direction. Similarly, the top surface 23 and the bottom surface 24 are formed to be longer in the front-rear direction than in the left-right direction, and the side surfaces 25 and 26 are formed to be longer in the up-down direction than in the front-rear direction. Moreover, the case body 2 has an oblique surface 27 and oblique surfaces 28a and 28b at locations corresponding to any corners of the rectangular parallelepiped shape in addition to the aforementioned six surfaces. The oblique surface 27 is inclined relative to the front surface 21 and the bottom surface 24 and connects the front surface 21 with the bottom surface 24. Similarly, the oblique surface 28a is inclined relative to the rear surface 22 and the top surface 23 and connects the rear surface 22 with the top surface 23, and the oblique surface 28b is inclined relative to the rear surface 22 and the bottom surface 24 and connects the rear surface 22 with the bottom surface 24.

"Substantially rectangular parallelepiped shape" in the embodiment in relation to the case body 2 does not refer to a rectangular shape in which all the inner angles are 90 degrees, but may refer to a rectangular parallelepiped shape in which at least one corner is chamfered like an oblique surface.

Figure 2:
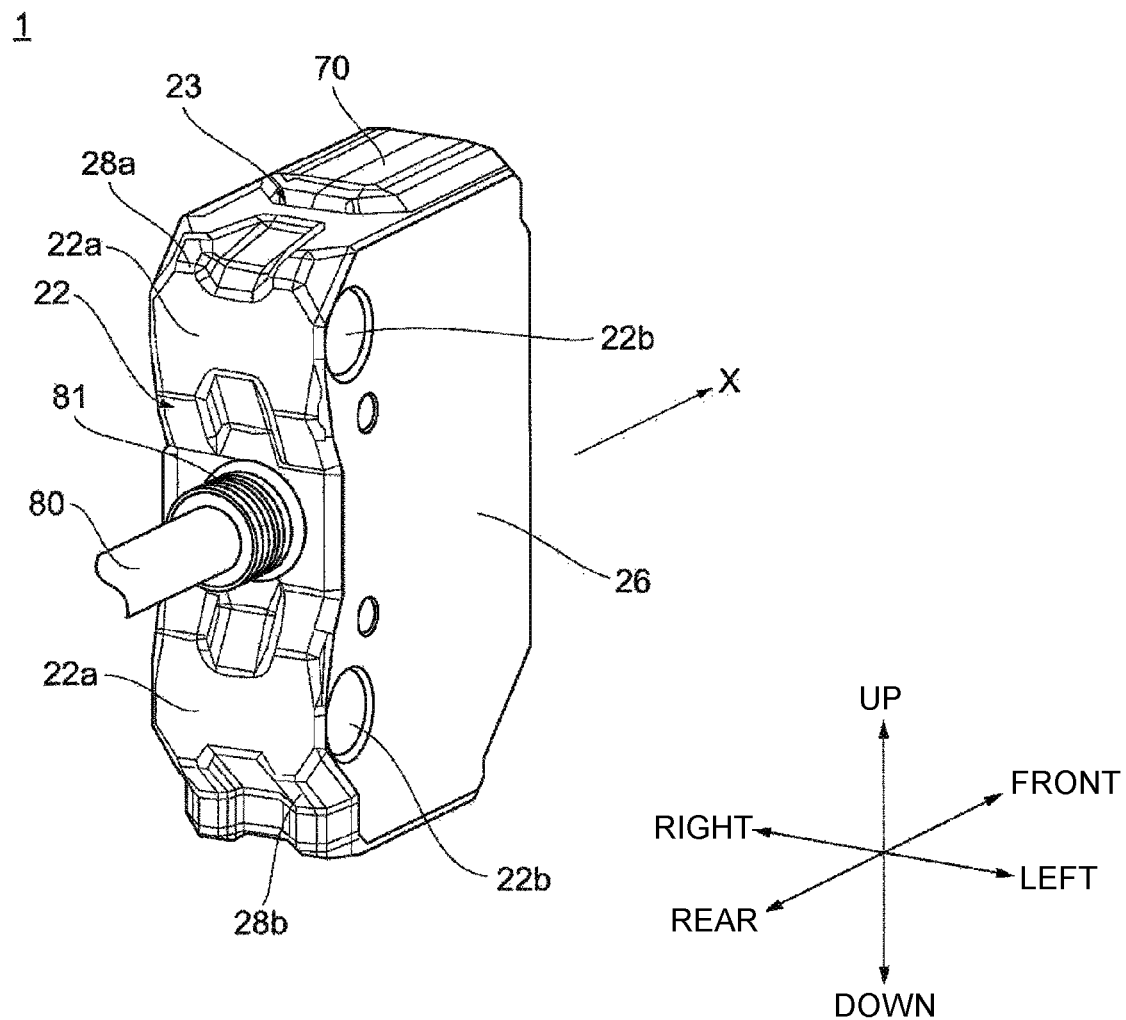
FIG. 2 is a perspective view of the photoelectric sensor in FIG. 1 when seen from another direction.
Figure 3:
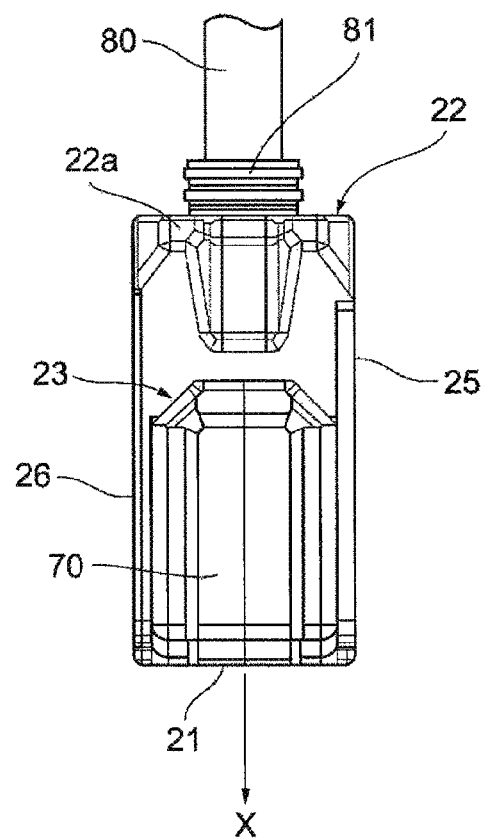
FIG. 3 is a plan view of the photoelectric sensor in FIG. 1 when seen from a side of a top surface.
Figure 4:
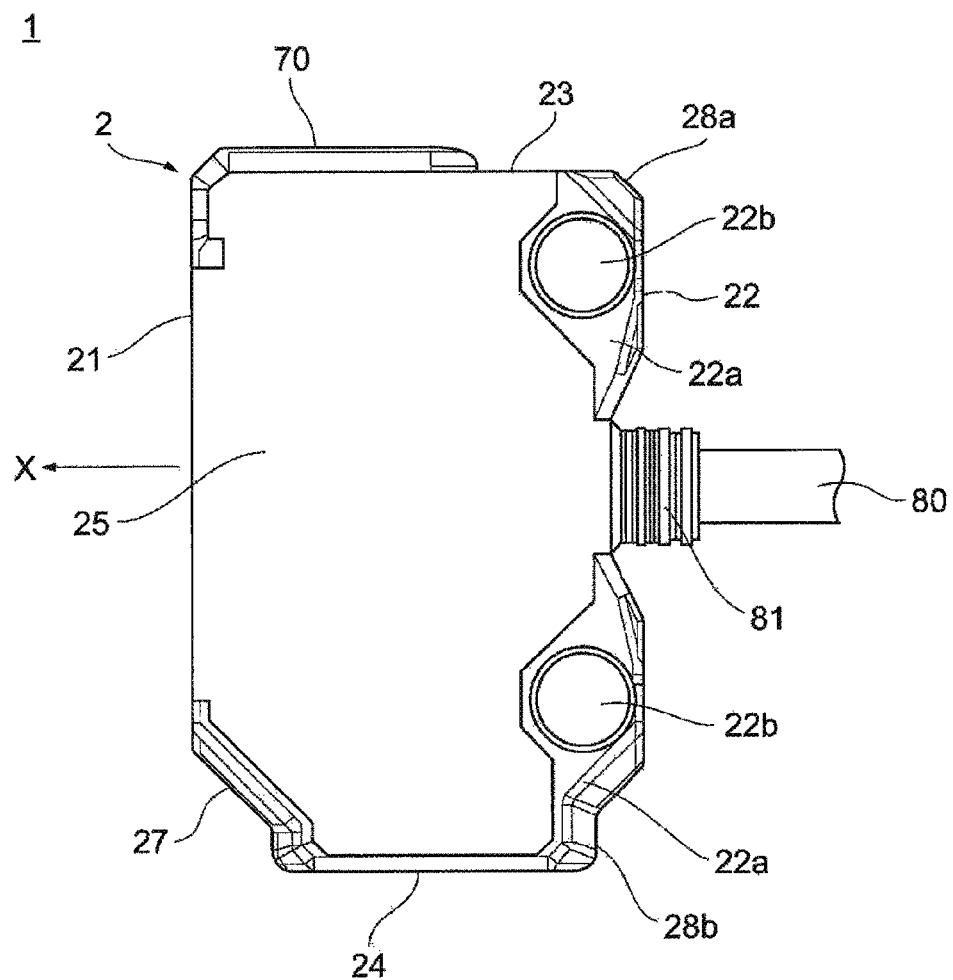
FIG. 4 is a side view of the photoelectric sensor in FIG. 1.

The front surface 21 has a light projecting and receiving surface 21a that allows light from the light projecting section 31 and light to the light receiving section 32 to pass therethrough. The top surface 23 is adjacent to the front surface 21 and extends in a direction that intersects perpendicularly to the front surface 21 and the rear surface 22. A plurality of attachment section 22a for securing the case body 2 to the outside when the photoelectric sensor 1 is placed are provided on the rear surface 22 as illustrated in FIG. 2 and the like. The attachment sections 22a are provided on the upper side on the rear surface 22 (the upper direction side in FIG. 5) and on the lower side on the rear surface 22 (the lower direction side in FIG. 5). The attachment sections 22a have protruding shapes toward the rear side beyond a portion of the rear surface 22 to which the cable 80 is attached. In other words, the portion of the rear surface 22 to which the cable 80 is attached has a shape that is recessed toward the front side beyond the attachment sections 22a. The attachment sections 22a have attachment holes 22b therein. The attachment holes 22b are holes for securing the photoelectric sensor 1 with predetermined securing tools (not illustrated) when the photoelectric sensor 1 is used.

Figure 5:
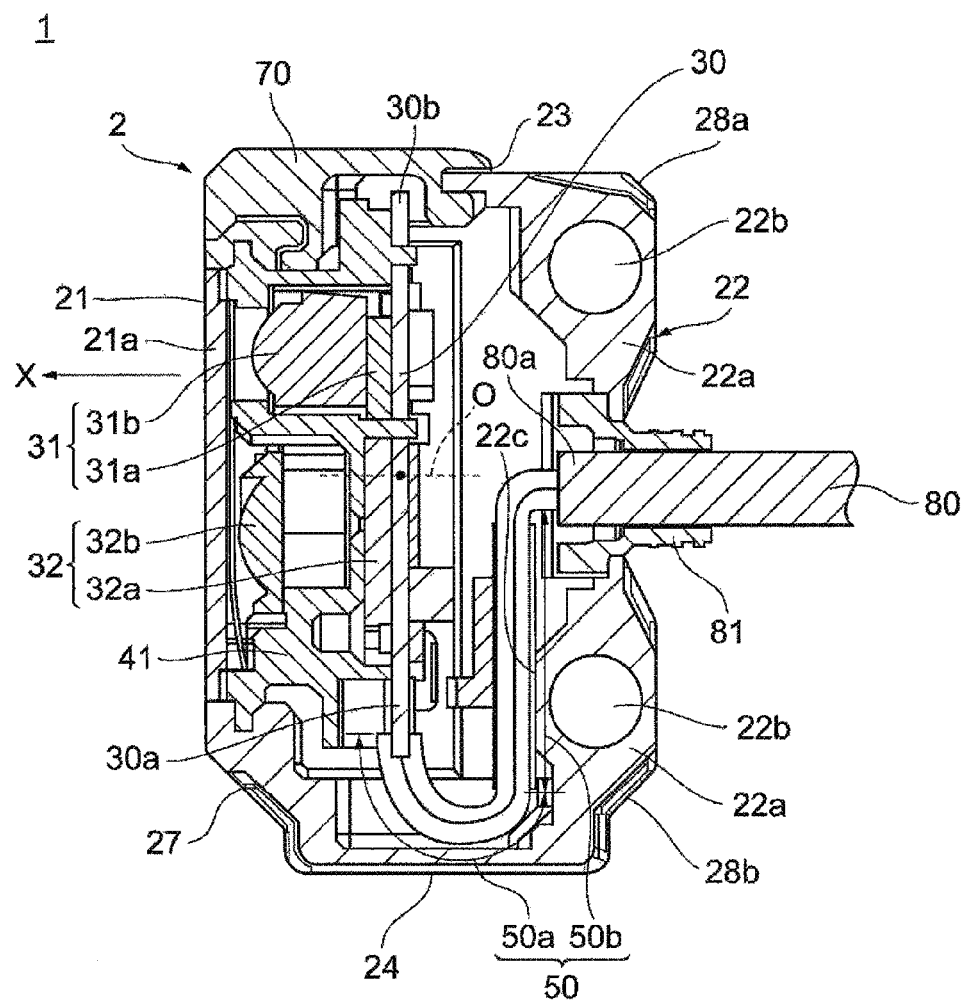
FIG. 5 is a sectional view illustrating a section taken along V-V in FIG. 1.

The cable 80 is a member for supplying power from the outside to a light projecting and receiving substrate 30 (FIG. 5), the light projecting section 31, the light receiving section 32, and the like and for transmitting a signal that has been electrically processed by the light receiving section 32 to the outside. The cable 80 accommodates cords 50 therein for transmitting and receiving signals between the light projecting and receiving section and the outside as illustrated in FIG. 5. In the embodiment, the cable 80 is attached to the rear surface 22 of the case body 2. Specifically, the cable 80 is attached between the attachment section 22a on the rear surface 22 on the upper side and the attachment section 22a on the rear surface 22 on the lower side (that is, at the center of the rear surface 22).

In addition, the cable 80 is attached to the rear surface 22 such that an end 80a thereof is located inside the case body 2 as illustrated in FIG. 5, and a cable protection member 81 that covers at least the periphery of the end 80a is provided. The cable protection member 81 is provided such that the cable protection member 81 covers a portion of the cable 80 that is located inside the case body 2 and a portion of the cable 80 that is connected to the rear surface 22, for example. By covering the periphery of the end 80a of the cable 80 with the cable protection member 81 as described above, for example, when the cable 80 is used in a bent state, it is possible to prevent the cable 80 from being bent from the side of the end 80a, and bending durability of the cable 80 can be improved.

Moreover, a display section 70 is provided on the side of the top surface 23 of the case body 2. The display section 70 is turned on in accordance with a power status or a detection status of the photoelectric sensor 1. For example, the display section 70 has a power light that is turned on when the power source is turned on and an operation display light that is turned on when a detection target is detected. The power light and the operation display light are made of LEDs, for example, and are turned on with mutually different display colors.

Next, configurations of the light projecting section 31, the light receiving section 32, the light projecting and receiving substrate 30, the cords 50, and the like accommodated in the case body 2 will be described.

As illustrated in FIG. 5, the light projecting section 31 projects light to the detection target and has a light projecting element 31a and a light projecting lens 31b. The light projecting element 31a is a light emitting diode or a laser diode, for example, and an optical axis X thereof is in parallel with the front-rear direction (the left-right direction in FIG. 5). The light receiving section 32 receives reflected light of the light projected to the detection target and has a light receiving element 32a and a light receiving lens 32b. The light receiving element 32a is a photodiode, two-split photodiodes, a photodiode-incorporated IC, or a position detection element, for example. It is possible to use transmission, retroreflection, diffusion reflection, and limited reflection, for example, as a detection principle for determining presence or absence of the detection target, and it is possible to use a principle of time of flight (TOF) or triangulation, for example, as a detection principle of distance measurement for obtaining a distance to the detection target. For example, in a case in which the principle of triangulation is used in the aforementioned configuration, the light emitted from the light projecting element 31a is projected to the detection target through the light projecting lens 31b, and the light reflected by the detection target forms an image on the light receiving element 32a through the light receiving lens 32b. The light receiving element 32a outputs two light receiving signals in accordance with the image formation location and transmits the light receiving signals to a control circuit via an amplifier. The amplifier and the control circuit are incorporated in the photoelectric sensor 1, and in the control circuit, a location signal value calculated from the two received light receiving signals is compared with a threshold value, and the distance to the detection target is obtained.

On the light projecting and receiving substrate 30, the light projecting element 31a, the light receiving element 32a, a light projecting circuit for driving the light projecting element 31a, which is not illustrated in the drawing, and a light receiving circuit for electrically processing the light receiving signals of the light receiving elements 32a, which is not illustrated in the drawing, are mounted. Light emitted from the light projecting element 31a mounted on the light projecting and receiving substrate 30 is guided to the light projecting lens 31b, and the light that is incident from the light receiving lens 32b is guided to the light receiving element 32a. The light projecting and receiving substrate 30 is formed to have substantially a plate shape, and in the example illustrated in FIG. 5, the light projecting and receiving substrate 30 is disposed to extend in the up-down direction of the case body 2.

Moreover, the light projecting and receiving substrate 30 and a pair of lenses (the light projecting lens 31b and the light receiving lens 32b) are coupled with each other with the bracket 41 as illustrated in FIG. 5. The light projecting and receiving substrate 30 and the pair of lenses coupled with each other with the bracket 41 are held by a holding tool (not illustrated) made of a resin and are accommodated in the case body 2.

The cords 50 are connected to at least one of the light projecting section 31 and the light receiving section 32 via a control section (not illustrated). The control section controls light emission of the light projecting section 31 and generates an output signal by processing the amount of light received from the light receiving section 32. The cords 50 are formed into a wire shape, for example, and are formed by covering a conductive element with an insulating member. An accommodation space for accommodating the cords 50 is provided in the case body 2. One end of each cord 50 is connected to an end 30a of the light projecting and receiving substrate 30, passes through the inside of the case body 2, and is drawn out of the side of the rear surface 22 to the outside. The cable 80 assembled in which a plurality of cords 50 are gathered and covered with a predetermined protecting covering member (for example, a sheath) is attached to the rear surface 22 of the case body 2. It is possible to transmit the electric signal processed by the light receiving section 32 to the outside via the cable 80 that accommodates the cords 50, for example, by disposing the cords 50 connected to the end 30a of the light projecting and receiving substrate 30 in this manner.

In the embodiment, the location at which the cords 50 are connected to the light projecting and receiving substrate 30 is separated from the placement location of the light projecting and receiving section. Specifically, the light projecting section 31 and the light receiving section 32 mounted on the light projecting and receiving substrate 30 are disposed at locations that are closer to the end 30b on the side opposite to the end 30a to which the cords 50 are connected. In other words, the light projecting and receiving section is arranged on the side of the end 30b on the side opposite to the end 30a than the central axial line O (FIG. 5) of the light projecting and receiving substrate 30. In yet other words, the light projecting and receiving section is disposed on the light projecting and receiving substrate 30 such that the distance from the end 30a of the light projecting and receiving substrate 30 to the placement location of the light projecting and receiving section is longer than the distance from the end 30b on the side opposite to the end 30a to the placement location of the light projecting and receiving section. It is possible to sufficiently secure the distance between the light projecting and receiving section and the connection part (end 30a) between the cords 50 and the light projecting and receiving substrate 30 by defining the arrangement of the light projecting and receiving section and the connection part of the cords 50 in this manner. In this manner, it is possible to suppress occurrence of noise that is generated when the connection location between the cords 50 and the light projecting and receiving substrate 30 is located in the vicinity of the light projecting and receiving section.

Moreover, although FIG. 5 illustrates the example in which the cords 50 are connected to the end 30a of the light projecting and receiving substrate 30 (the end of the light projecting and receiving substrate 30 on the lower side in FIG. 5), the disclosure is not limited to the example illustrated in the drawing. For example, a configuration in which the cords 50 are connected to the end 30b of the light projecting and receiving substrate 30 on the upper side and the light projecting and receiving section is disposed at a location that is closer to the end 30a may also be employed. That is, it is only necessary that the location at which the cords 50 be connected to the light projecting and receiving substrate 30 and the placement location of the light projecting and receiving section be disposed such that they are separated from each other, and various other modifications can be made.

In addition, the cords 50 have a portion 50a that extends from the end 30a of the light projecting and receiving substrate 30 to a surface side of in the case body 2 and that is curved toward the side of the rear surface 22 and a portion 50b that extends from the portion 50a to the side of the end 80a of the cable 80. In the embodiment, the cords 50 have the portion 50a that extends from the end 30a of the light projecting and receiving substrate 30 to the side of the bottom surface 24 in the case body 2 and that is curved toward the side of the rear surface 22 and the portion 50b that extends from the portion 50a to the side of the end 80a of the cable 80 along the side of the rear surface 22 in the case body 2 (in other words, the surface 22c on the side of the rear surface in the case body 2). It is possible to sufficiently secure the cord length from the end 30a of the light projecting and receiving substrate 30 to the end 80a of the cable 80 by disposing the cords 50 in the case body 2 in this manner. In this manner, it is possible to suppress oscillation delivered from the outside to the light projecting and receiving substrate 30 via the cords 50.

Moreover, the aforementioned portion 50a and portion 50b that form the cords 50 are not limited to those in the example illustrated in FIG. 5, and it is possible to change the configuration of the cords 50 to have a variety of shapes and sizes as long as the portion 50a and the portion 50b have a function of suppressing the oscillation delivered to the light projecting and receiving substrate 30 via the cords 50.

According to the embodiment described above, the cable 80 that accommodates the cords 50 for transmitting and receiving signals between the light projecting and receiving section and the outside is attached to the rear surface 22 located on the side opposite to the light projecting and receiving surface 21a that allows the light from the light projecting section 31 and the light to the light receiving section 32 to pass therethrough.

Figure 7:
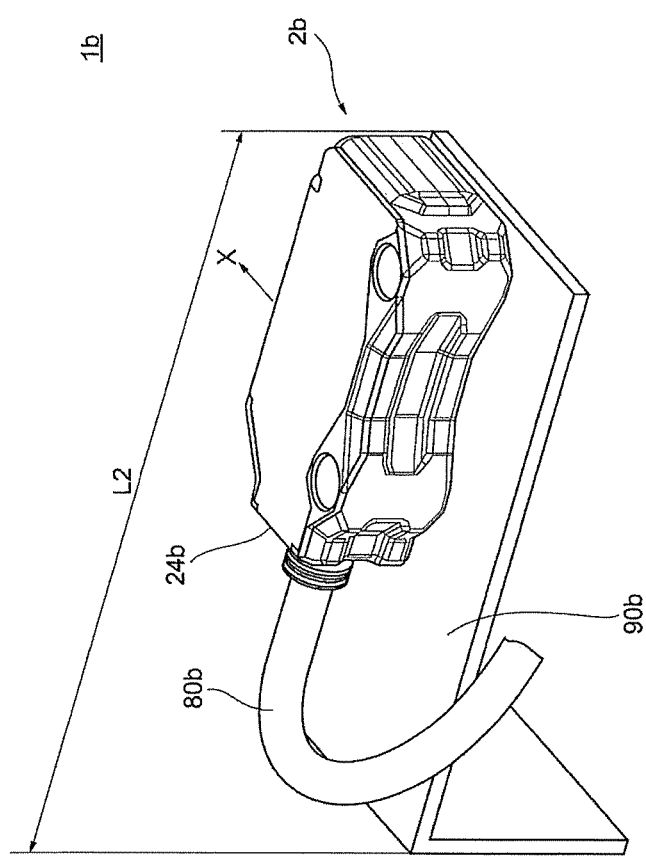
FIG. 7 is a diagram illustrating an example in which a photoelectric sensor in the related art is attached to the outside.

In a case in which a photoelectric sensor 1b with a cable 80b connected to a bottom surface 24b of a case body 2b is used as illustrated in FIG. 7, for example, it is necessary to prepare a space for routing the cable 80b depending on the placement orientation of the photoelectric sensor 1b. That is, in a case in which the photoelectric sensor 1b is placed such that the side surface of the photoelectric sensor 1b is caused to abut on a predetermined placement member 90b as illustrated in FIG. 7, a space for routing the cable 80b may be provided on the side of the bottom surface 24b of the case body 2b, and it is necessary to secure a length L2 in the up-down direction of the case body 2b. Moreover, FIG. 7 illustrates an example in which the cable 80b connected to the side of the bottom surface 24b of the case body 2b is bent in a direction on the side opposite to the optical axis X.

Figure 6:
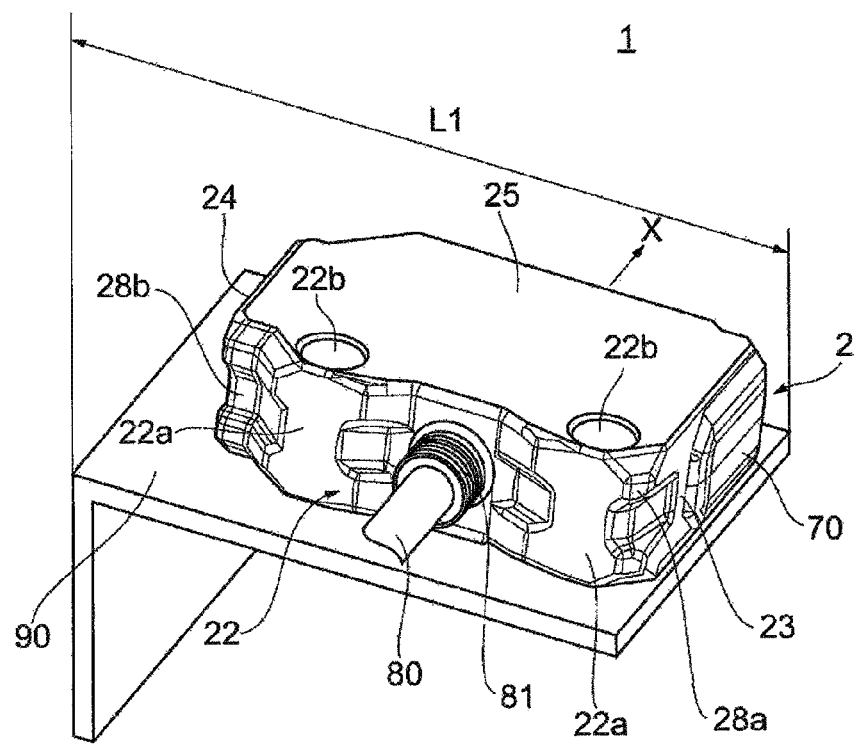
FIG. 6 is a diagram illustrating an example in which the photoelectric sensor in FIG. 1 is attached to the outside.

Meanwhile, according to the photoelectric sensor 1 of the embodiment, it is not necessary to secure the space for routing the cable 80 on the side of the bottom surface 24 of the case body 2 even in a case in which the photoelectric sensor 1 is placed such that the side surface of the case body 2 is caused to abut on the predetermined placement member 90 since the cable 80 is attached to the rear surface 22 of the case body 2 as illustrated in FIG. 6. Also, it is not necessary to prepare a jig for routing the cable. As a result, it is possible to shorten the length L1 in the up-down direction of the case body 2 as compared with L2 (FIG. 7) and thereby saving the space for the photoelectric sensor 1. In a case in which a plurality of photoelectric sensors 1 illustrated in FIG. 6 are disposed in parallel in the up-down direction of the case body 2, a difference in the placement space in the up-down direction of the case body 2 becomes significant as compared with the configuration illustrated in FIG. 7. Specifically, in a case in which a plurality of photoelectric sensors 1 are used in parallel in the up-down direction of the case body 2 (that is, in a case in which the adjacent photoelectric sensors 1 are placed such that the bottom surface 24 of the case body 2 of one photoelectric sensor 1 and the top surface 23 of the case body 2 of the other photoelectric sensor 1 are adjacent to each other), it is possible to further save the placement space in the up-down direction of the case body 2 as compared with a case in which the plurality of photoelectric sensors 1b illustrated in FIG. 7 are similarly placed in parallel.

The embodiments described above are for facilitating understanding of the disclosure and is not intended to limit interpretation of the disclosure. The respective elements included the embodiments and arrangement, materials, conditions, shapes, sizes, and the like thereof are not limited to those described as examples and can be appropriately changed. Also, it is possible to partially replace or combine configurations described in different embodiments.

(Supplementary Note)

A photoelectric sensor 1 that has at least one of a light projecting section 31 that emits light to a front space and a light receiving section 32 that receives light from a front zone, the photoelectric sensor 1 including:

a case body 2 with a substantially rectangular parallelepiped shape that accommodates the light projecting section 31 and the light receiving section 32, wherein the case body 2 includes:

a front surface 21 that has a light projecting and receiving surface 21a that allows the light from the light projecting section 31 and the light to the light receiving section 32 to pass therethrough, and a rear surface 22 that is located on a side opposite to the front surface 21, at least one of the light projecting section 31 and the light receiving section 32 is connected to the cords 50 via a control section, and a cable 80 that accommodates the cords 50 is attached to the rear surface 22.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A photoelectric sensor that has at least one of a light projecting section that emits light to a front space and a light receiving section that receives light from a front zone, the photoelectric sensor comprising:
   a case body with a substantially rectangular parallelepiped shape that accommodates at least one of the light projecting section and the light receiving section,
   wherein the case body comprising:
      a front surface that has a light projecting and receiving surface that allows at least one of the light from the light projecting section and the light to the light receiving section to pass therethrough, and
      a rear surface that is located on a side opposite to the front surface,
   at least one of the light projecting section and the light receiving section is connected to a cord via a control section, and
   a cable that accommodates the cord is attached to the rear surface,
   wherein a plurality of attachment sections for securing the case body to an outside are provided on the rear surface, and the cable is attached between the attachment section that is located on an upper side on the rear surface and the attachment section that is located on a lower side on the rear surface.

2. The photoelectric sensor according to claim 1,
   wherein the cable is attached to the rear surface such that an end of the cable is located inside the case body, and a protection member that covers a periphery of the end is provided.

3. The photoelectric sensor according claim 2, wherein the case body further accommodates a substrate on which the light projecting section and the light receiving section are mounted and a portion of the cord that is not covered with the cable.

4. The photoelectric sensor according to claim 3,
   wherein the cord is connected to an end of the substrate formed into substantially a plate shape, and
   the light projecting section and the light receiving section are disposed closer to an end of the substrate opposite to the end of the substrate.

5. The photoelectric sensor according to claim 4, wherein the cord has a portion that extends from the end of the substrate to one surface side inside the case body and is curved toward the side of the rear surface and a portion that extends from the portion to a side of the end of the cable.

6. The photoelectric sensor according to claim 3, wherein the cord has a portion that extends from the end of the substrate to one surface side inside the case body and is curved toward the side of the rear surface and a portion that extends from the portion to a side of the end of the cable.

7. The photoelectric sensor according claim 1, wherein the case body further accommodates a substrate on which the light projecting section and the light receiving section are mounted and a portion of the cord that is not covered with the cable.

8. The photoelectric sensor according to claim 7,
   wherein the cord is connected to an end of the substrate formed into substantially a plate shape, and
   the light projecting section and the light receiving section are disposed closer to an end of the substrate opposite to the end of the substrate.

9. The photoelectric sensor according to claim 8, wherein the cord has a portion that extends from the end of the substrate to one surface side inside the case body and is curved toward the side of the rear surface and a portion that extends from the portion to a side of the end of the cable.

10. The photoelectric sensor according to claim 7, wherein the cord has a portion that extends from the end of the substrate to one surface side inside the case body and is curved toward the side of the rear surface and a portion that extends from the portion to a side of the end of the cable.

* * * * *